United States Patent
Yoon et al.

(10) Patent No.: US 8,027,206 B2
(45) Date of Patent: Sep. 27, 2011

(54) BIT LINE VOLTAGE CONTROL IN SPIN TRANSFER TORQUE MAGNETORESISTIVE RANDOM ACCESS MEMORY

(75) Inventors: Sei Seung Yoon, San Diego, CA (US);
Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 126 days.

(21) Appl. No.: 12/362,500

(22) Filed: Jan. 30, 2009

(65) Prior Publication Data

US 2010/0195376 A1   Aug. 5, 2010

(51) Int. Cl.
*G11C 7/10* (2006.01)

(52) U.S. Cl. .............. 365/189.06; 365/158; 365/189.08; 365/210.1

(58) Field of Classification Search ............. 365/189.06, 365/158, 189.08, 210.1
See application file for complete search history.

(56) References Cited

U.S. PATENT DOCUMENTS

| | | | | |
|---|---|---|---|---|
| 5,640,343 | A * | 6/1997 | Gallagher et al. ............ | 365/171 |
| 6,625,057 | B2 * | 9/2003 | Iwata ............................ | 365/158 |
| 6,831,866 | B1 * | 12/2004 | Kirihata ..................... | 365/189.06 |
| 7,272,034 | B1 * | 9/2007 | Chen et al. .................... | 365/158 |
| 7,433,253 | B2 * | 10/2008 | Gogl et al. .................... | 365/209 |
| 7,471,588 | B2 * | 12/2008 | Yu et al. ..................... | 365/230.05 |
| 7,596,014 | B2 * | 9/2009 | Kawahara et al. ............ | 365/158 |
| 7,626,878 | B1 * | 12/2009 | Lin et al. ........................ | 365/207 |
| 7,706,176 | B2 * | 4/2010 | Dittrich ........................ | 365/158 |
| RE41,325 | E * | 5/2010 | Yu et al. ..................... | 365/230.05 |
| 7,751,258 | B2 * | 7/2010 | Tsuchida .................. | 365/189.09 |
| 2007/0280021 | A1 | 12/2007 | Ueda et al. | |

FOREIGN PATENT DOCUMENTS

| WO | WO2008109772 | 9/2008 |
|---|---|---|
| WO | WO2009052371 | 4/2009 |

OTHER PUBLICATIONS

Hosomi M., et al. "A novel nonvolatile memory with spin torque transfer magnetization switching: spin-RAM" IEEE, Sony Corporation, 2005, p. 4.
International Search Report & Written Opinion—PCT/US2010/022474—International Search Authority—European Patent Office—May 21, 2010.

* cited by examiner

*Primary Examiner* — Viet Q Nguyen
(74) *Attorney, Agent, or Firm* — Michelle Gallardo; Nicholas J. Pauley; Jonathan T. Velasco

(57) ABSTRACT

A Spin Transfer Torque Magnetoresistive Random Access Memory (STT-MRAM) and associated read operations are disclosed. A bit cell includes a magnetic tunnel junction (MTJ) and a word line transistor, the bit cell being coupled to a bit line and a source line. A clamping circuit is coupled to the bit line and is configured to clamp the bit line voltage to a desired voltage level during a read operation of the STT-MRAM to prevent the bit line voltage from exceeding the desired voltage level. The desired voltage level is less than a write voltage threshold associated with a write operation of the STT-MRAM.

19 Claims, 6 Drawing Sheets

PARALLEL MAGNETIZATION
LOW RESISTANCE
STATE "0"

ANTIPARALLEL MAGNETIZATION
HIGH RESISTANCE
STATE "1"

READ & WRITE

BIT LINE VOLTAGE CONTROL IN SPIN TRANSFER TORQUE MAGNETORESISTIVE RANDOM ACCESS MEMORY

FIELD OF DISCLOSURE

Embodiments of the invention are related to random access memory (RAM). More particularly, embodiments of the invention are related to bit line voltage control in Spin Transfer Torque Magnetoresistive Random Access Memory (STT-MRAM).

BACKGROUND

Random access memory (RAM) is a ubiquitous component of modern digital architectures. RAM can be stand alone devices or can be integrated or embedded within devices that use the RAM, such as microprocessors, microcontrollers, application specific integrated circuits (ASICs), system-on-chip (SoC), and other like devices as will be appreciated by those skilled in the art. RAM can be volatile or non-volatile. Volatile RAM loses its stored information whenever power is removed. Non-volatile RAM can maintain its memory contents even when power is removed from the memory. Although non-volatile RAM has advantages in the ability to maintain its contents without having power applied, conventional non-volatile RAM has slower read/write times than volatile RAM.

Magnetoresistive Random Access Memory (MRAM) is a non-volatile memory technology that has response (read/write) times comparable to volatile memory. In contrast to conventional RAM technologies which store data as electric charges or current flows, MRAM uses magnetic elements. As illustrated in FIGS. 1A and 1B, a magnetic tunnel junction (MTJ) storage element 100 can be formed from two magnetic layers 110 and 130, each of which can hold a magnetic field, separated by an insulating (tunnel barrier) layer 120. One of the two layers (e.g., fixed layer 110), is set to a particular polarity. The other layer's (e.g., free layer 130) polarity 132 is free to change to match that of an external field that can be applied. A change in the polarity 132 of the free layer 130 will change the resistance of the MTJ storage element 100. For example, when the polarities are aligned, FIG. 1A, a low resistance state exists. When the polarities are not aligned, FIG. 1B, then a high resistance state exists. The illustration of MTJ 100 has been simplified and those skilled in the art will appreciate that each layer illustrated may comprise one or more layers of materials, as is known in the art.

Referring to FIG. 2A, a memory cell 200 of a conventional MRAM is illustrated for a read operation. The cell 200 includes a transistor 210, bit line 220, digit line 230 and word line 240. The cell 200 can be read by measuring the electrical resistance of the MTJ 100. For example, a particular MTJ 100 can be selected by activating an associated transistor 210, which can switch current from a bit line 220 through the MTJ 100. Due to the tunnel magnetoresistive effect, the electrical resistance of the MTJ 100 changes based on the orientation of the polarities in the two magnetic layers (e.g., 110, 130), as discussed above. The resistance inside any particular MTJ 100 can be determined from the current, resulting from the polarity of the free layer. Conventionally, if the fixed layer 110 and free layer 130 have the same polarity, the resistance is low and a "0" is read. If the fixed layer 110 and free layer 130 have opposite polarity, the resistance is higher and a "1" is read.

Referring to FIG. 2B, the memory cell 200 of a conventional MRAM is illustrated for a write operation. The write operation of the MRAM is a magnetic operation. Accordingly, transistor 210 is off during the write operation. Current is propagated through the bit line 220 and digit line 230 to establish magnetic fields 250 and 260 that can affect the polarity of the free layer of the MTJ 100 and consequently the logic state of the cell 200. Accordingly, data can be written to and stored in the MTJ 100.

MRAM has several desirable characteristics that make it a candidate for a universal memory, such as high speed, high density (i.e., small bitcell size), low power consumption, and no degradation over time. However, MRAM has scalability issues. Specifically, as the bit cells become smaller, the magnetic fields used for switching the memory state increase. Accordingly, current density and power consumption increase to provide the higher magnetic fields, thus limiting the scalability of the MRAM.

Unlike conventional MRAM, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During the write operation, the spin-polarized electrons exert a torque on the free layer, which can switch the polarity of the free layer. The read operation is similar to conventional MRAM in that a current is used to detect the resistance/logic state of the MTJ storage element, as discussed in the foregoing. As illustrated in FIG. 3A, a STT-MRAM bit cell 300 includes MTJ 305, transistor 310, bit line 320 and word line 330. The transistor 310 is switched on for both read and write operations to allow current to flow through the MTJ 305, so that the logic state can be read or written.

Referring to FIG. 3B, a more detailed diagram of a STT-MRAM cell 301 is illustrated, for further discussion of the read/write operations. In addition to the previously discussed elements such as MTJ 305, transistor 310, bit line 320 and word line 330, a source line 340, sense amplifier 350, read/write circuitry 360 and bit line reference 370 are illustrated. As discussed above, the write operation in an STT-MRAM is electrical. Read/write circuitry 360 generates a write voltage between the bit line 320 and the source line 340. Depending on the polarity of the voltage between bit line 320 and source line 340, the polarity of the free layer of the MTJ 305 can be changed and correspondingly the logic state can be written to the cell 301. Likewise, during a read operation, a read current is generated, which flows between the bit line 320 and source line 340 through MTJ 305. When the current is permitted to flow via transistor 310, the resistance (logic state) of the MTJ 305 can be determined based on the voltage differential between the bit line 320 and source line 340, which is compared to a reference 370 and then amplified by sense amplifier 350. Those skilled in the art will appreciate the operation and construction of the memory cell 301 is known in the art. Additional details are provided, for example, in M. Hosomi, et al., A Novel Nonvolatile Memory with Spin Transfer Torque Magnetoresistive Magnetization Switching: Spin-RAM, proceedings of IEDM conference (2005), which is incorporated herein by reference in its entirety.

The electrical write operation of STT-MRAM eliminates the scaling problem due to the magnetic write operation in MRAM. Further, the circuit design is less complicated for STT-MRAM. However, because both read and write operations are performed by passing current through the MTJ 305, there is a potential for read operations to disturb the data stored in the MTJ 305. For example, if the read current is similar to or greater in magnitude than the write current threshold, then there is a substantial chance the read operation may disturb the logic state of MTJ 305 and thus degrade the integrity of the memory.

SUMMARY

Exemplary embodiments of the invention are directed to systems, circuits and methods for controlling the bit line voltage applied during a read operation in STT-MRAM.

Accordingly, an embodiment of the invention includes a Spin Transfer Torque Magnetoresistive Random Access Memory (STT-MRAM), comprising: a bit cell having a magnetic tunnel junction (MTJ) and a word line transistor, the bit cell being coupled to a bit line and a source line; and a clamping circuit coupled to the bit line, the clamping circuit being configured to clamp the bit line voltage to a desired voltage level during a read operation of the STT-MRAM to prevent the bit line voltage from exceeding the desired voltage level, wherein the desired voltage level is less than a write voltage threshold associated with a write operation of the STT-MRAM.

Another embodiment of the invention includes a method for reading a Spin Transfer Torque Magnetoresistive Random Access Memory (STT-MRAM), comprising: initiating a read operation; activating a clamping circuit coupled to a bit line of a bit cell being read; and clamping a bit line voltage to a desired voltage level during the read operation, wherein the desired voltage level is less than a write voltage threshold associated with a write operation of the STT-MRAM.

Another embodiment of the invention includes Spin Transfer Torque Magnetoresistive Random Access Memory (STT-MRAM), comprising: means for initiating a read operation of a bit cell having a magnetic tunnel junction (MTJ) and a word line transistor, the bit cell being coupled to a bit line and a source line; and means for clamping a bit line voltage to a desired voltage level during the read operation, wherein the desired voltage level is less than a write voltage threshold associated with a write operation of the STT-MRAM.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1A:
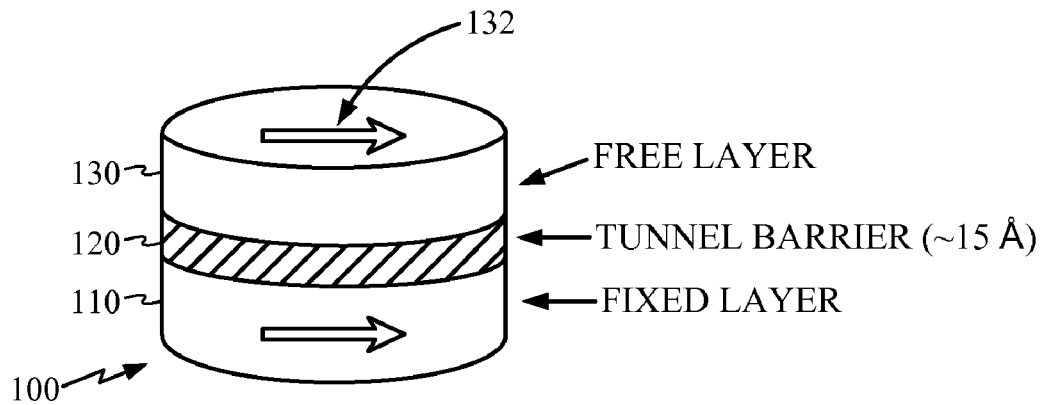
FIGS. 1A and 1B are illustrations of a magnetic tunnel junction (MTJ) storage element.
Figure 1B:
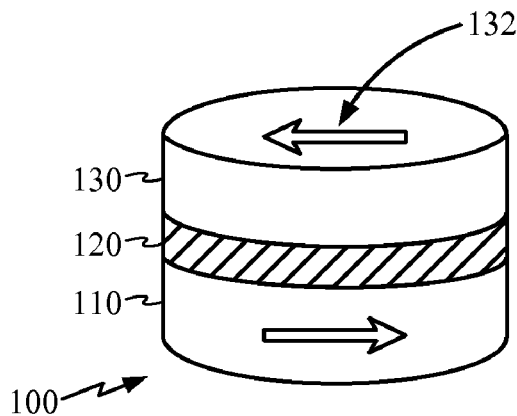
Figure 2A:
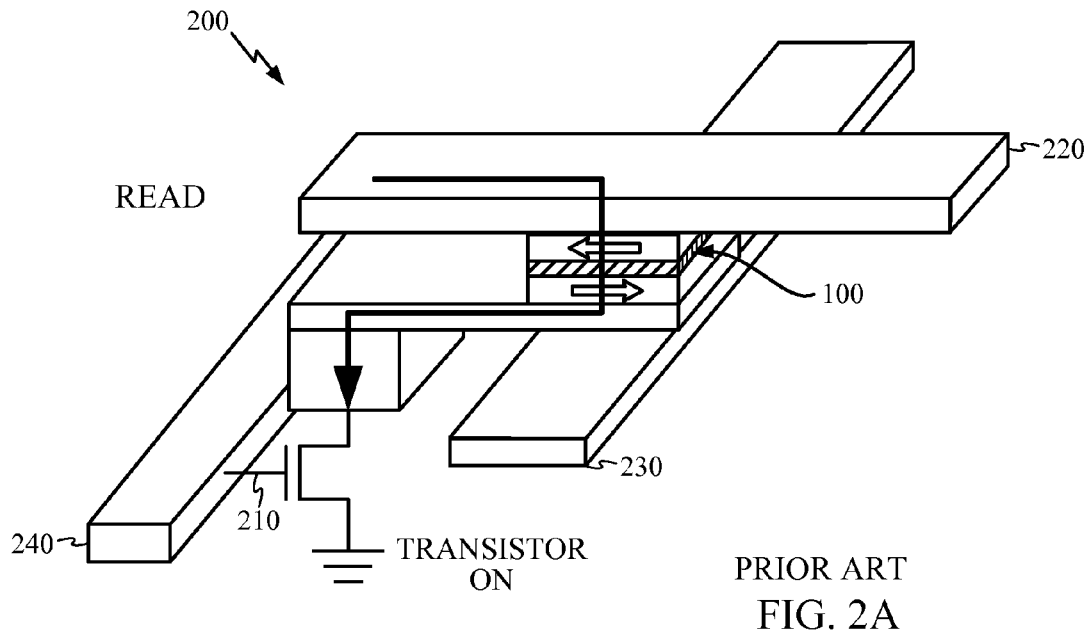
FIGS. 2A and 2B are illustrations of a Magnetoresistive Random Access Memory (MRAM) cell during read and write operations, respectively.
Figure 2B:
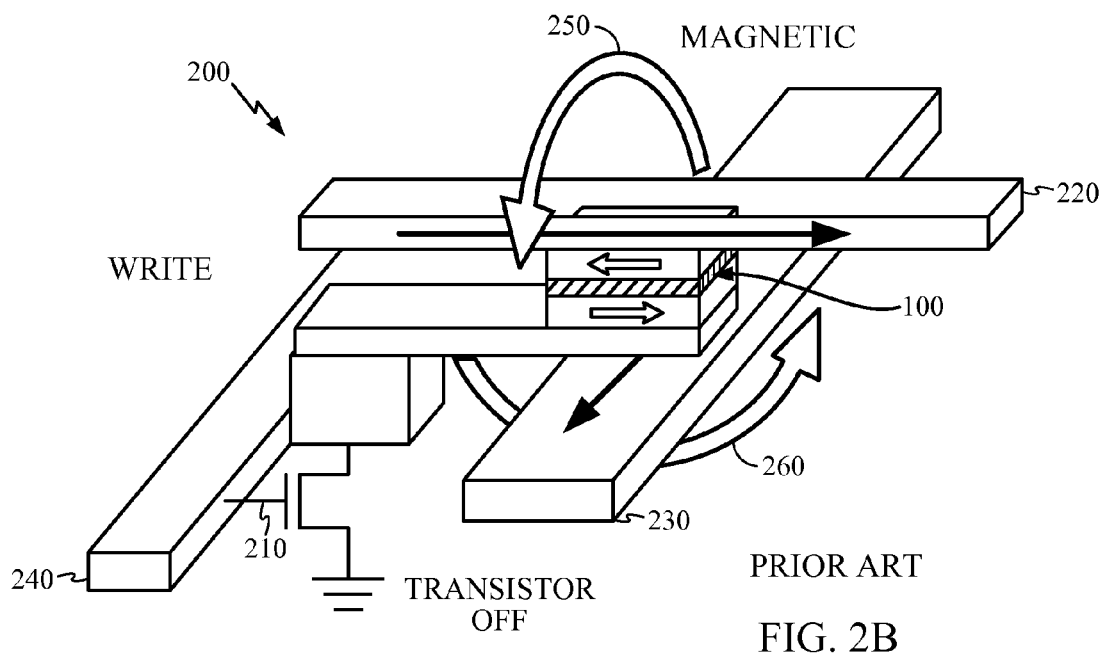
Figure 3A:
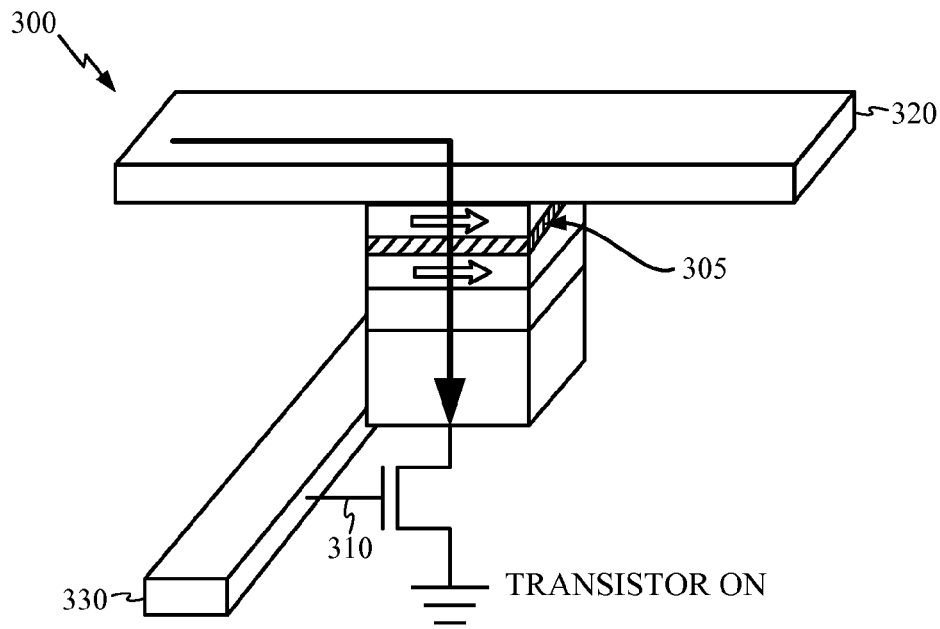
FIGS. 3A and 3B are illustrations of Spin Transfer Torque Magnetoresistive Random Access Memory (STT-MRAM) cells.
Figure 3B:
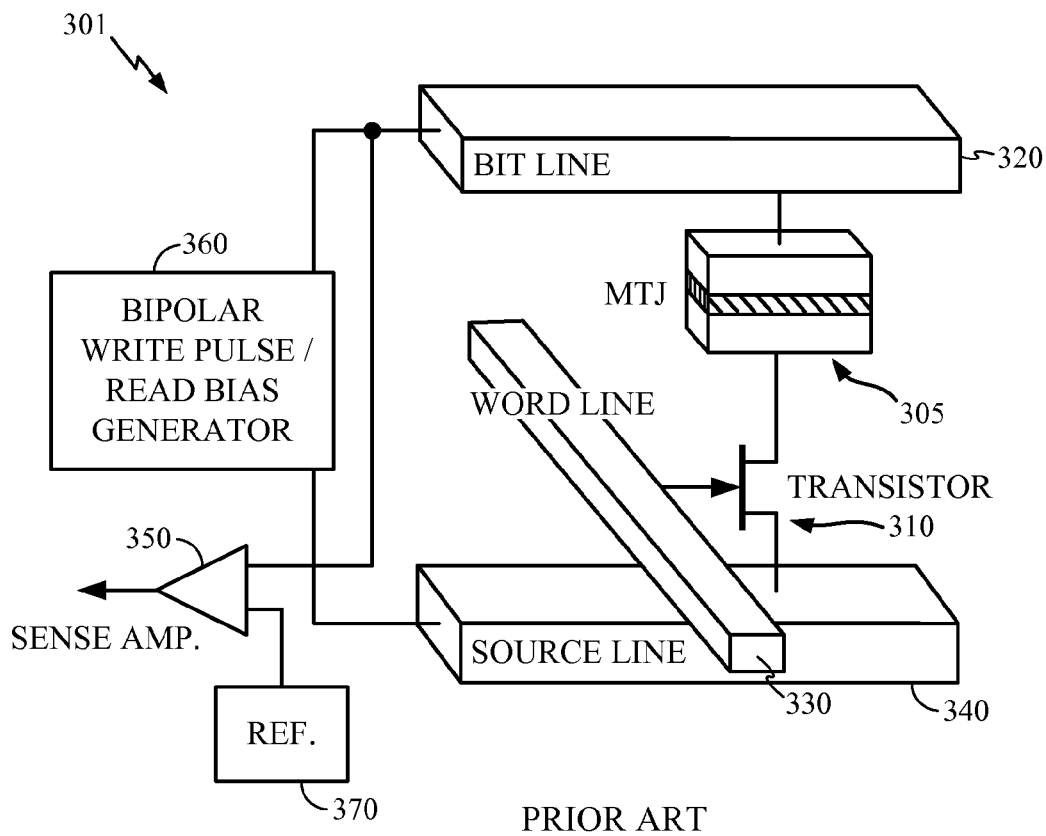

Aspects of embodiments of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of embodiments of the invention.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

As discussed in the background, STT-MRAM uses a low write current for each cell, which is an advantage of this memory type over MRAM. However, the cell read current can approach or be higher than the write current threshold and thus cause an invalid write operation to occur. To reduce the potential of an invalid write, embodiments of the invention provide for clamping the cell read level to below the write threshold. Clamping the cell read level reduces or prevents the possibility of inducing an invalid write during any given read operation, and improves memory integrity.

Figure 4:
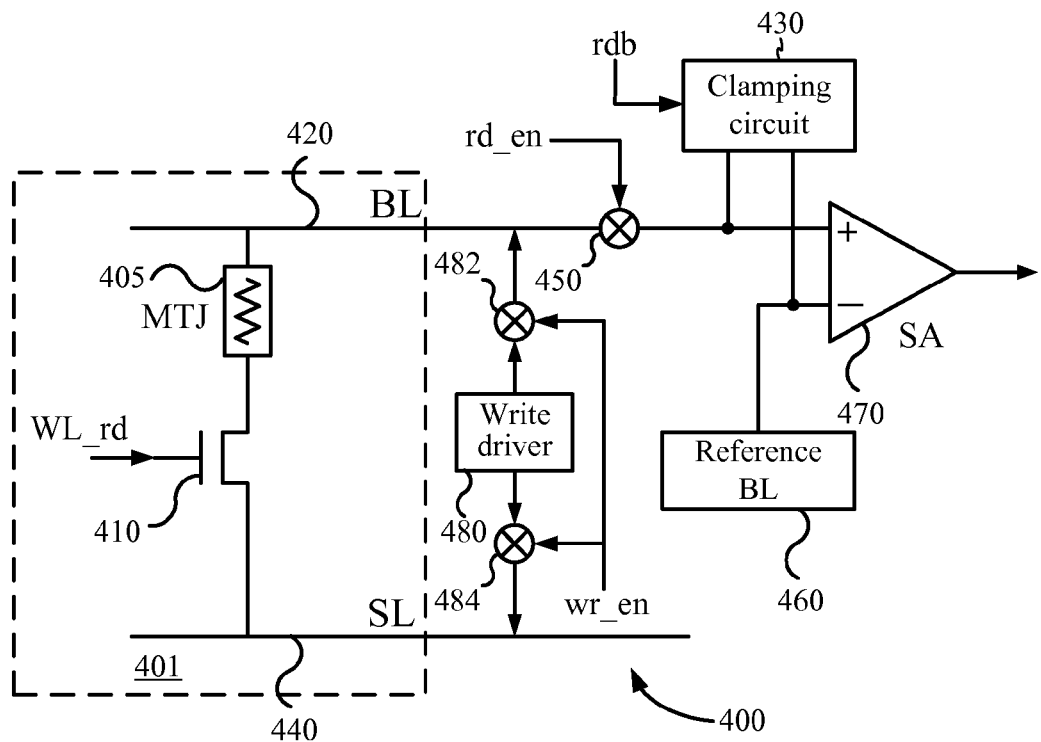
FIG. 4 illustrates a circuit configuration in a STT-MRAM during a read operation.

FIG. 4 illustrates a circuit configuration 400 in a STT-MRAM during a read operation. The circuit includes a bit cell 401 including a MTJ 405 and word line transistor 410 coupled between bit line (BL) 420 and source line (SL) 440. Word line transistor 410 receives a word line read voltage (WL_rd) from the word line (not shown). A read isolation element 450 is coupled to the bit line 420 to isolate sense amplifier 470 during a write operation. Element 450 (e.g., read mux) can be used to select one of the bit lines during read operation as well as provide sense amplifier isolation. As will be appreciated by those skilled in the art, read isolation element 450 can be any device or combination of devices that can couple the sense amplifier 470 to the bit line 420 during read operations and can isolate sense amplifier 470 during the write operations.

For example, the isolation element 450 can be a transmission gate coupled in series with an input of sense amplifier 470. However, those skilled in the art will appreciate that other devices and/or combinations of devices such as multiplexers and the like may be used. Further, those skilled in the art will appreciate that the circuit configuration illustrated herein is merely to facilitate the description of aspects of embodiments of the invention and is not intended to limit the embodiments to the illustrated elements and/or arrangements.

Referring back to FIG. 4, the isolation element 450 can receive a read enable signal (rd_en) to coordinate with the read operation. A sense amplifier 470 is coupled to the bit line 420 and to a reference 460. Sense amplifier 470 can be used to determine the state of the bit cell 401 by amplifying the voltage differential between the bit line 420 and the reference 460 at the input of the sense amplifier 470 during the read operation. During the read operation, transistor 410 is conducting and a read current (i_rd) flows through the MTJ 405. The read isolation element 450 will be conducting and a voltage in proportion to the resistance of the MTJ 405 will be generated and detected at sense amplifier 470. As discussed above, the resistance will vary based on the logic state of the MTJ 405. Accordingly, the data stored in bit cell 401 can be read. A write driver 480 and write isolation elements 482 and 484 are coupled between the bit line 420 and source line 440 to enable selection of a bit line and writing data to bit cell 401.

STT-MRAM 400 of FIG. 4 additionally includes a clamping circuit 430 coupled to BL 420. Clamping circuit 430 is configured to clamp the BL voltage to a desired clamping voltage level during a read operation of STT-MRAM 400 to prevent the BL voltage from exceeding the desired clamping voltage level. As described above, by setting the desired clamping voltage level to less than a write BL voltage threshold associated with a write operation of the STT-MRAM, the cell read level can be substantially prevented from inducing an invalid write operation, thereby protecting data integrity. For example, for a write BL voltage threshold of about 0.4V, the desired clamping voltage level may be set to about 0.3V. One skilled in the art will appreciate that the actual value of the desired voltage level is application specific and depends on the write BL voltage threshold as well as an acceptable error margin (e.g., 0.1V for the above example). The above example is therefore provided merely for illustration purposes, and not intended to limit the scope of embodiments of the invention.

Clamping circuit 430 is further coupled to the reference 460 and further configured to clamp the reference BL voltage to the desired clamping voltage level so as not to disturb the operation of sense amplifier 470 during read operations. That is, the potential negative impact of clamping of the BL voltage is negated by equivalent clamping of the reference BL voltage as far as sense amplifier 470 is concerned.

Clamping circuit 430 is controlled by a read pre-charge signal (rdb). When the rdb signal is active (e.g., low), embodiments of the invention discharge the BL and reference BL to the desired clamping voltage. During a write operation, the read isolation element 450 interposed between the bit cell 401 and clamping circuit 430 is configured to selectively isolate the clamping circuit 430 from the BL 420 during a write operation.

Figure 5:
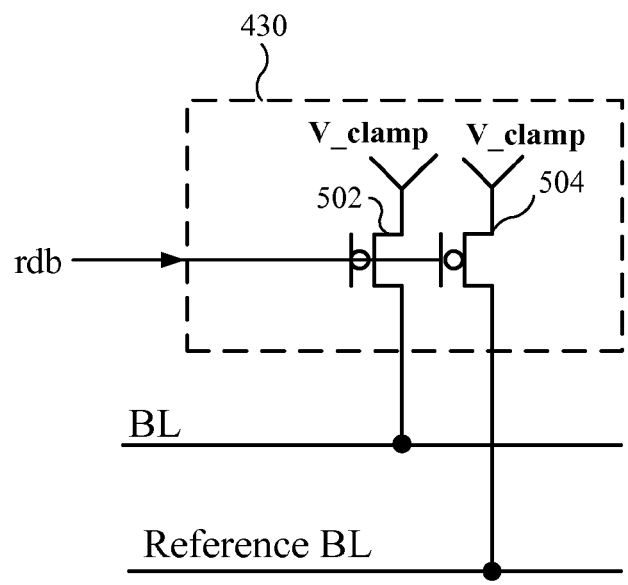
FIG. 5 is an illustration of a circuit configuration for the clamping circuit of a STT-MRAM.

FIG. 5 is an illustration of a circuit configuration for the clamping circuit 430 of a STT-MRAM.

As shown, clamping circuit 430 includes two pre-charge transistors 502 and 504 coupled to the BL and reference BL, respectively, at a first terminal, and coupled to the desired clamping voltage V_clamp at a second terminal. Each of the pre-charge transistors 502 and 504 are controlled by the rdb signal to discharge the BL and reference BL, respectively, to the desired clamping voltage V_clamp.

The desired clamping voltage V_clamp may be provided by any number of sources. For example, in one embodiment the desired clamping voltage V_clamp may be provided by a band gap reference. In another embodiment, the desired clamping voltage may be provided by an internal voltage controller (IVC). In yet another embodiment the desired clamping voltage may be provided by a power management IC (PMIC) external to STT-MRAM 400. Each of these reference voltage source mechanisms is well known in the art, and therefore a more detailed discussion here will be omitted.

Referring to FIGS. 4 and 5, one skilled in the art will appreciate that sense amplifier 470 may alternatively be implemented as a current sense amplifier. In a case where sense amplifier 470 is implemented as a current sense amplifier, the voltage source mechanism providing the desired clamping voltage V_clamp may further provide current to bit cell 401.

Figure 6:
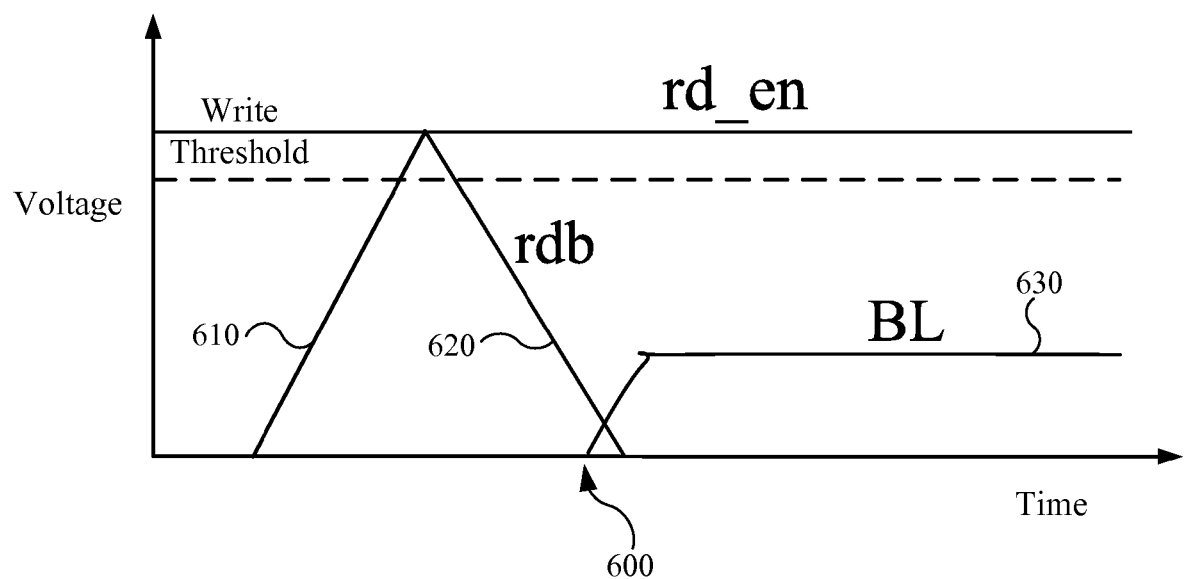
FIG. 6 is a graph illustrating various signal line states during a read operation of a STT-MRAM.

FIG. 6 is a graph illustrating various signal line states during a read operation of a STT-MRAM.

During a read operation, the read enable signal rd_en 610 provided to isolation element 450 switches from a low state to a high state. The BL read pre-charge signal rdb 620 subsequently transitions from a high state to a low state. By transitioning from a high state to a low state, rdb 620 activates the clamping circuit 430, which provides for clamping the BL voltage to the desired clamping voltage level to prevent any invalid data write operations. Then, at time 600, a voltage 630 on the BL can be established that corresponds to the logic state stored in bit cell 401 (e.g., by turning on transistor 410 to read the value of the MTJ 405).

In view of the foregoing, it will be appreciated that embodiments of the invention can also include methods for performing the functions, sequence of actions and/or algorithms described herein. For example, an embodiment of the invention can include a method for read operations in a Spin Transfer Torque Magnetoresistive Random Access Memory (STT-MRAM) device including clamping the bit line voltage to a desired voltage level during a read operation of the STT-MRAM to prevent the bit line voltage from exceeding the desired voltage level. Moreover, it will be appreciated that any of the alternative functionalities describe herein may further be included in methods of embodiments of the invention.

Figure 7:
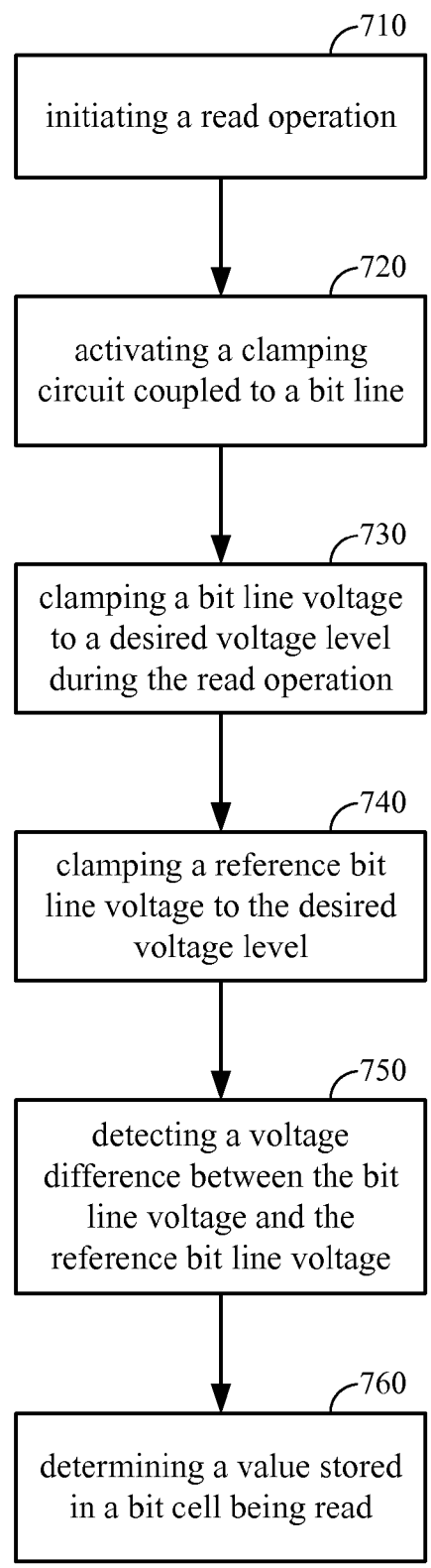
FIG. 7 is a flowchart illustrating a method for clamping the bit line voltage during a read operation in an STT-MRAM.

For example, a flowchart illustrating a method for reading a Spin Transfer Torque Magnetoresistive Random Access Memory (STT-MRAM) is illustrated in FIG. 7. In block 710, the read operation can be initiated. A clamping circuit coupled to a bit line of the STT-MRAM bit cell being read can be activated in block 720. Then, in block 730, the bit line voltage can be clamped to a desired voltage level during the read operation. The desired voltage level being a voltage less than a write voltage threshold associated with a write operation of the STT-MRAM. It will be appreciated that "clamped" as used herein means to prevent a voltage from exceeding the desired voltage level and does not necessarily mean the clamped voltage is maintained at a specific voltage level.

Referring back to FIG. 7, in block 740, a reference bit line voltage can also be clamped to the desired voltage during the read operation as discussed above. This can be performed by a common clamping circuit or may be performed by independent devices. Regardless of the implementation, clamping both the bit line and reference bit line allows for consistent reading of the bit cell, by preventing any extraneous voltage differential due to the clamping operation. In block 750, the voltage differential between the bit line and the reference bit line can be detected. Based on the detected voltage difference, the binary value stored in the bit cell being read can be determined (e.g., by outputting a voltage representative of the binary value by the sense amp), in block 760. It will be appreciated that each of the blocks discussed in the foregoing may have the functionality combined or further separated in various embodiments of the invention. Still further, it will be appreciated the sequence of the blocks does not limit embodiments of the invention to the specific sequence illustrated or require that all blocks and associated functionalities be performed.

In the foregoing description, the STT-MRAM has been illustrated and described at the bit cell level merely for convenience of explanation and not to limit embodiments of the invention. It will be appreciated that embodiments of the STT-MRAM include memory arrays that include a plurality of bit cells and associated elements that can be arranged in various row and column configurations, as is well known, and accordingly will not be further discussed herein.

While the foregoing disclosure shows illustrative embodiments of the invention, it should be noted that various changes and modifications could be made herein without departing from the scope of embodiments of the invention as defined by the appended claims. For example, specific logic signals corresponding to the transistors/circuits to be activated, may be changed as appropriate to achieve the disclosed functionality as the transistors/circuits may be modified to complementary devices (e.g., interchanging PMOS and NMOS devices). Likewise, the functions, steps and/or actions of the methods in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A Spin Transfer Torque Magnetoresistive Random Access Memory (STT-MRAM), comprising:
    a bit cell having a magnetic tunnel junction (MTJ) and a word line transistor, the bit cell being coupled to a bit line and a source line;
    a clamping circuit coupled to the bit line, the clamping circuit being configured to clamp the bit line voltage to a desired voltage level during a read operation of the STT-MRAM to prevent the bit line voltage from exceeding the desired voltage level, wherein the desired voltage level is less than a write voltage threshold associated with a write operation of the STT-MRAM; and
    a read isolation element interposed between the bit cell and the clamping circuit, the isolation element being configured to selectively isolate the clamping circuit from the bit line during a write operation.

2. The STT-MRAM of claim 1, wherein the desired voltage level is about 0.3V.

3. The STT-MRAM of claim 1, wherein the desired voltage level is provided by a band gap reference.

4. The STT-MRAM of claim 1, wherein the desired voltage is provided by an internal voltage controller.

5. The STT-MRAM of claim 1, wherein the desired voltage is provided by an external power management IC.

6. The STT-MRAM of claim 1, wherein the clamping circuit includes at least one pre-charge transistor configured to discharge the bit line to the desired voltage level based on a received pre-charge signal.

7. The STT-MRAM of claim 6, wherein the pre-charge signal is initiated subsequent to beginning the read operation.

8. The STT-MRAM of claim 1, further comprising:
    a sense amplifier configured to output a value stored in the bit cell based on the difference between the bit line voltage and a reference bit line voltage, wherein the clamping circuit is further coupled to the reference bit line and further configured to clamp the reference bit line voltage to the desired voltage level during a read operation.

9. The STT-MRAM of claim 1, wherein the read isolation element is at least one of a switch, a transmission gate, or a multiplexer.

10. A method for reading a Spin Transfer Torque Magnetoresistive Random Access Memory (STT-MRAM), comprising:
    initiating a read operation;
    activating a clamping circuit coupled to a bit line of a bit cell being read; and
    clamping a bit line voltage to a desired voltage level during the read operation, wherein the desired voltage level is less than a write voltage threshold associated with a write operation of the STT-MRAM, and wherein the clamping circuit is selectively isolated from the bit line during the write operation.

11. The method of claim 10, wherein the desired voltage level is about 0.3V.

12. The method of claim 10, wherein the desired voltage level is provided by at least one of a band gap reference, an internal voltage controller or an external power management IC.

13. The method of claim 10, wherein the clamping circuit includes at least one pre-charge transistor that is activated by a signal separate from a signal initiating the read. operation.

14. The method of claim 10, wherein activating the clamping circuit occurs after the read operation is initiated.

15. The method of claim 10, further comprising:
    clamping a reference bit line voltage to the desired voltage level during the read operation;
    detecting a voltage difference between the bit line voltage and the reference bit line voltage; and
    determining a value stored in the bit cell being read based on the detected difference between the bit line voltage and reference bit line voltage.

16. A Spin Transfer Torque Magnetoresistive Random Access Memory (STT-MRAM), comprising:
    means for initiating a read operation of a bit cell having a magnetic tunnel junction (MTJ) and a word line transistor, the bit cell being coupled to a bit line and a source line;
    means for clamping a bit line voltage to a desired voltage level during the read operation, wherein the desired voltage level is less than a write voltage threshold associated with a write operation of the STT-MRAM; and
    means for selectively isolating the clamping circuit from the bit line during the write operation.

17. The STT-MRAM of claim 16, wherein the desired voltage level is provided by at least one of a band gap reference, an internal voltage controller or an external power management IC.

18. The STT-MRAM of claim 17, wherein the clamping means includes at least one pre-charge transistor that is activated by a signal separate from a signal initiating the read operation.

19. The STT-MRAM of claim 17, further comprising:
    means for clamping a reference bit line voltage to the desired voltage level during the read operation;
    means for detecting a voltage difference between the bit line voltage and the reference bit line voltage; and
    means for outputting a voltage indicating a value stored in the bit cell being read based on the detected difference between the bit line voltage and reference bit line voltage.

* * * * *